US007052355B2

(12) United States Patent
Liu et al.

(10) Patent No.: US 7,052,355 B2
(45) Date of Patent: May 30, 2006

(54) ORGANIC ELECTRO-OPTIC DEVICE AND METHOD FOR MAKING THE SAME

(75) Inventors: Jie Liu, Niskayuna, NY (US); Anil Raj Duggal, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 56 days.

(21) Appl. No.: 10/695,781

(22) Filed: Oct. 30, 2003

(65) Prior Publication Data

US 2005/0093001 A1 May 5, 2005

(51) Int. Cl.

| | |
|---|---|
| ***H01J 1/62*** | (2006.01) |
| ***H01J 9/32*** | (2006.01) |
| ***H01J 9/24*** | (2006.01) |
| ***H01J 9/00*** | (2006.01) |
| ***H01J 9/26*** | (2006.01) |

(52) U.S. Cl. .......................... 445/24; 445/25; 313/504

(58) Field of Classification Search ................. 445/24, 445/25; 313/504

See application file for complete search history.

(56) References Cited

U.S. PATENT DOCUMENTS

| | | | | |
|---|---|---|---|---|
| 5,516,577 | A | 5/1996 | Matsuura et al. | |
| 5,686,360 | A * | 11/1997 | Harvey et al. | 438/28 |
| 5,965,979 | A | 10/1999 | Friend et al. | |
| 6,758,713 | B1 * | 7/2004 | Wei et al. | 445/24 |
| 6,867,539 | B1 * | 3/2005 | McCormick et al. | 313/504 |
| 2004/0058612 | A1 * | 3/2004 | Hiji et al. | 445/24 |

FOREIGN PATENT DOCUMENTS

| | | |
|---|---|---|
| EP | 913444 | 5/1999 |

OTHER PUBLICATIONS

Patent Abstracts of Japan, vol. 2000, No. 13, Feb. 5, 2001, & JP 2000 298099A (Citiizen Watch Co. Ltd.), Oct. 24, 2000.

Gufeng He, Yongfang Li, Jie Liu and Yang Yang, "Enhanced Electroluminescence Using Polystyrene as a Matrix," Applied Physics Letters, vol. 80, No. 22, Jun. 3, 2002, p. 4247-4249.

(Continued)

*Primary Examiner*—Joseph Williams
*Assistant Examiner*—Peter Macchiarolo
(74) *Attorney, Agent, or Firm*—Andrew J. Caruso; William E. Powell, III

(57) ABSTRACT

The present invention directed to an organic light emitting device and method for making the same. The method comprises the steps of: forming a first component comprising at least one first material on a first substrate; forming a second component comprising at least one second material on a second substrate, wherein at least one opening is formed through the second component; forming a third component; and laminating the first component, the second component and the third component together such that the second component is located between the first component and the third component, the at least one first material and the at least one second material form at least part of an organic electro-optic device located between the first substrate and the second substrate, the third component is bonded to the second component, and the third component is bonded to the first component through the at least one opening.

17 Claims, 10 Drawing Sheets

212
214
23
216
206
208
210
22
21
204
202
200
24

OTHER PUBLICATIONS

Anil R. Duggal, J.J. Shiang, Christian M. Heller, and Donald F. Foust, "Organic Light-emitting Devices for Illumination Quality White Light," Applied Physics Letters, vol. 80, No. 19, May 13, 2002, p. 3470-3472.

Ullrich Mitschke and Peter Bauerle, "The Electroluminescence of Organic Materials," J. Mater. Chem., 2000, 10, 1471-1507 (Jun. 6, 2000).

G. Parthasarathy, J. Liu and A.R. Duggal, "Organic Light Emitting Devices From Displays to Lighting," The Electrochemical Society Interface, Summer 2003, p. 42-47.

Tzung-Fang Guo, Seugmoon Pyo, Shun-Chi Chang and Yang Yang, "High Performance Polymer Light-Emitting Diodes Fabricated by a Low Temperature Lamination Process," Adv. Funct. Mater. 2001, 11, No. 5, Oct. 2001, p. 339-343.

* cited by examiner 212
214
206
208
210
204
202
200
216
24
23
22
21

314
316
308
310
312
306
304
302
300
318
33
32
31
34

44
414
416
408
410
412
404
402
400
43
42
41

Efficiency (lm/w)
3
2
1
0
0
2
4
6
8
10
current density (mA/cm2)
61
62

920
918
V
+
-
94
916
914
908
910
912
906
93
92
904
902
900
91

ORGANIC ELECTRO-OPTIC DEVICE AND METHOD FOR MAKING THE SAME

BACKGROUND OF THE INVENTION

The present invention relates generally to the field of electro-optics, and more particularly to an organic electro-optic device and method for making the same.

Organic electro-optic devices include organic light emitting devices (OLEDs) and organic photovoltaic devices, for example. An OLED typically comprises one or more semiconducting organic thin films sandwiched between two electrodes, one of which is usually transparent. When a forward bias is applied, injected electrons and holes recombine in the organic layers to generate light. Organic light emitting devices have great potential in the display and lighting industry. Due to their increased brightness, faster response time, lighter weight and lower power consumption, OLED displays are expected to replace liquid crystal display (LCD) applications in the near future.

Another type of organic electro-optic device is a photovoltaic device. A photovoltaic cell typically comprises a pair of electrodes and a light-absorbing photovoltaic material disposed therebetween. When the photovoltaic material is irradiated with light, electrons that have been confined to an atom in the photovoltaic material are released by light energy to move freely. Thus, free electrons and holes are generated. The free electrons and holes are efficiently separated so that electric energy is continuously extracted. An organic photovoltaic device typically has a similar material composition and/or structure as an OLED yet performs an opposite energy conversion process.

Organic light emitting devices are traditionally fabricated in a batch process by sequentially depositing the organic thin films followed by a thin metal cathode onto a transparent, anode-bearing substrate such as glass or a flexible plastic. A number of disadvantages exist with this manufacturing approach, however. For example, one or more vacuum processes are typically necessary to facilitate deposition of the organic materials and/or the metal electrode(s). The presence of vacuum processes greatly increases the cost of the much desired roll-to-roll (R2R) process where a roll of substrate can be continuously converted into a roll of product. In addition, since the cathode metal and active materials in an OLED are sensitive to air and water vapor and degrade rapidly if left unpackaged, it is often necessary to encapsulate traditionally fabricated devices in an inert gas ambient. These extra packaging process steps are typically lengthy and costly. With the traditional deposition processes, it can also be difficult to produce reliable OLED products with large area. Due to the vacuum process, the size of an OLED product manufactured with traditional methods is usually limited by the size of the high-vacuum equipment.

These and other drawbacks exist in known systems and techniques.

BRIEF SUMMARY OF THE INVENTION

The present invention is directed to an organic electro-optic device and method for making the same that overcome these and other drawbacks of known systems and methods. Though only organic light emitting devices and methods for making the same will be described hereinafter, it should be noted that embodiments of the present invention may apply to all types of organic electro-optic devices, including light emitting devices, photovoltaic devices and photo-detectors.

According to an exemplary embodiment, the invention relates to a method for making an electro-optic device comprising the steps of: forming a first component comprising at least one first material on a first substrate; forming a second component comprising at least one second material on a second substrate, wherein at least one opening is formed through the second component; forming a third component; and laminating the first component, the second component and the third component together such that the second component is located between the first component and the third component, the at least one first material and the at least one second material form at least part of an organic electro-optic device located between the first substrate and the second substrate, the third component is bonded to the second component, and the third component is bonded to the first component through the at least one opening.

According to another exemplary embodiment, the invention relates to an electro-optic device comprising a first component comprising at least one first material on a first substrate; a second component comprising at least one second material on a second substrate, wherein there is at least one opening formed through the second component; and a third component; the first component, the second component and the third component being laminated together such that the second component is located between the first component and the third component, the at least one first material and the at least one second material form at least part of an organic electro-optic device located between the first substrate and the second substrate, the third component is bonded to the second component, and the third component is bonded to the first component through the at least one opening.

According to yet another exemplary embodiment, the invention relates to an electro-optic device comprising a first component comprising at least one first material on a first substrate; a second component comprising at least one second material on a second substrate; and a third component, where the first component and the third component are larger in area than the second component; the first component, the second component and the third component being laminated together such that the third component is bonded to the first component in locations that are beyond the edges of the second component, the second component is located between and encapsulated by the first component and the third component, and the at least one first material and the at least one second material form at least part of an organic electro-optic device located between the first substrate and the second substrate.

According to still another exemplary embodiment, the invention relates to an organic light emitting device comprising at least one composite layer, wherein the at least one composite layer comprises at least one organic light emissive material mixed with at least one adhesive material.

BRIEF DESCRIPTION OF THE DRAWINGS

In order to facilitate a fuller understanding of the present invention, reference is now made to the appended drawings, in which like elements are referenced with like numerals. These drawings should not be construed as limiting the present invention, but are intended to be exemplary only.

DETAILED DESCRIPTION OF THE INVENTION

Reference will now be made in detail to the exemplary embodiments of the invention, which are illustrated in the accompanying drawings.

Figure 1:
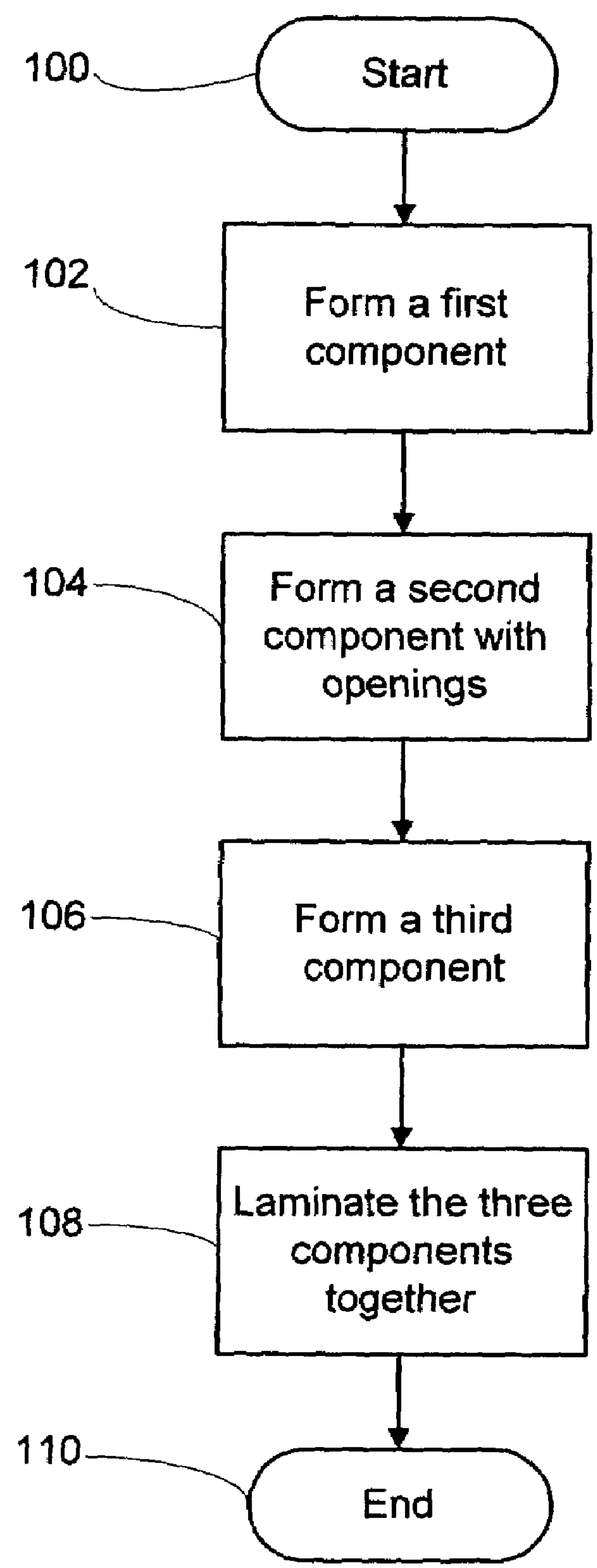
FIG. 1 is a flow chart illustrating an exemplary method for making an organic light emitting device according to an embodiment of the invention.

FIG. 1 is a flow chart illustrating an exemplary method for making an organic light emitting device according to an embodiment of the invention. The following description, in connection with FIG. 1, provides an overview of the exemplary method. More detailed description of exemplary embodiments of the present invention will be provided below in connection with FIGS. 2 through 6.

The exemplary method starts at step 100.

At step 102, a first component of an organic light emitting device may be formed. For example, a first substrate may be provided and coated with one or more layers of OLED materials. The OLED materials may include one or more of an organic light emissive material, a charge transport material or an electrode material, for example, in any desired combination. In one embodiment of the present invention, the first substrate itself may comprise one or more OLED materials. For example, the substrate may comprise indium tin oxide (ITO) or a metal foil. The first substrate, with or without thin film coatings, forms a first component for the organic light emitting device. Examples of electroluminescent (EL) materials that may be used in the first or second component include oligomers and polymers having a conjugated backbone, such as poly(p-phenylene vinylenes), polyphenylenes, polythiophene, polyquinolines, polyfluorenes, and their derivatives and mixtures. A second class of EL materials include oligomers and polymers not having a conjugated backbone, such as poly(vinylcarbazole). A third class of EL materials include oligomers and polymers having a non-conjugated backbone with chromophores side chains, such as polystyrene with quaterphenylene segments. A fourth class of EL materials include oligomers and polymers having a non-conjugated backbone with isolated chromophores, such as poly(disilanyleneoligothienylene). A fifth class of EL materials are low molecular weight semiconducting materials, mainly organo-metalic complexes, such as tris(8-quinolinolato)aluminum and its derivatives, and organic fluorescence dyes, such as coumarin. The above mentioned materials can be used alone or in any combination with others.

At step 104, a second component of the organic light emitting device may be formed. The second component may comprise a second substrate coated with one or more OLED materials (as described above) that, together with the OLED materials of the first component, may form the core structure of an organic light emitting device. According to one embodiment of the present invention, the second substrate itself may comprise one or more OLED materials. Depending on the desired structure, the material types and properties of the first substrate, the second substrate and the OLED materials coating the first and second substrates may be determined before step 102. The appropriate substrate preparation techniques and coating techniques may also be selected accordingly.

According to embodiments of the present invention, one or more openings may be formed through the second component. The openings may be etched or laser drilled or formed with any available techniques known in the art. The openings may be holes, lines or any other shapes depending on specific uses. These openings may be formed before or after deposition of the OLED materials on the second substrate. According to one embodiment of the present invention, the openings may be substantially perpendicular to the second substrate. The openings in the second component may serve to enhance adhesion and/or to provide a passage for electrical interconnections among the OLED components. According to another embodiment, the pattern of the openings, i.e. the number, shape and locations of the openings, may be varied depending on the desired use of the openings. For example, the openings may be regularly spaced to form a grid pattern.

At step 106, a third component of the organic light emitting device may be formed. The third component typically comprises a third substrate coated with one or more layers of adhesive materials that are capable of forming a strong mechanical bond to other materials, such as those of the second component and the first component. According to one embodiment of the present invention, the adhesive material may be a thermoplastic film or other suitable organic materials, such as epoxies, acrylates, acrylimide, isocyanates, polyurethanes, melamine formaldehyde and unsaturated polyesters. According to another embodiment of the present invention, an electrically conductive adhesive material, such as a conductive epoxy, may be used to provide interconnection among the OLED components and/or layers.

At step 108, the three components of the organic light emitting device may be laminated together to form an OLED product. The lamination process may involve application of heat, pressure and/or ultraviolet (UV) irradiation, if desired. According to one embodiment of the invention, a commercially available roller laminator, such as the Attalam™ 110L manufactured by Attalus High Tech Industry S.A., can be used. The Attalam™ 110L laminator has four silicon rollers and an adjustable temperature range between room temperature and 160° C. The lamination process may be performed such that the second component is located between the first and third component, the OLED materials on the first and second substrates form at least part of an OLED core structure between these two substrates, and the third component is bonded to the second substrate in non-opening areas and to the first component through the openings. The three components may be laminated together simultaneously in one step or they may be laminated in a two-step process where two of the components are laminated before the remaining component is laminated or otherwise attached thereto. A roller laminator with appropriate temperature and pressure settings may be used to laminate the components.

The exemplary method ends at step 110.

Exemplary embodiments of the present invention may provide a number of advantages. For example, since the three components of an organic light emitting device may be prefabricated with or without any vacuum process and the lamination process does not require a vacuum environment, the efficiency of the OLED fabrication process may be greatly improved and thus the related costs may be reduced. And due to the nature of the fabrication method taught in embodiments of the present invention, large-area (e.g., 6 inch by 6 inch and above) organic light emitting devices with multiple layers may be achieved, where, by selection of appropriate OLED materials, desirable electrical, optical and/or mechanical properties may be obtained. The openings in the second component may help to reduce the possibility of trapped gas bubbles and create intimate organic contact among the organic layers during lamination. In a finished OLED product made according to embodiments of the present invention, the OLED core structure is already protected by the first and second substrates. Therefore, any requirements for a hermetic sealing may have already been met without any extra packaging steps. Another advantage is that the light-extraction efficiency of the organic light emitting device may be further enhanced by properly engineering the structure and/or material of the third component. For example, the third component may be engineered and structured to contain scattering particles with desirable sizes and loadings in order to enhance the light-extraction.

According to embodiments of the present invention, in order to meet different specifications of an OLED product, the substrates of the three components may be varied. For example, the substrate of the third component may be designed to comprise one or more layers of color-modifying materials that can tune or convert the emission colors of the OLED product. For example, the substrate of the third component may include color-modifying materials such as one or more phosphors. According to one embodiment, the substrate of the third component comprises a down-conversion phosphor system comprising perylene orange, perylene red and inorganic phosphor particles, for example, to covert blue light into white light.

Figure 2:
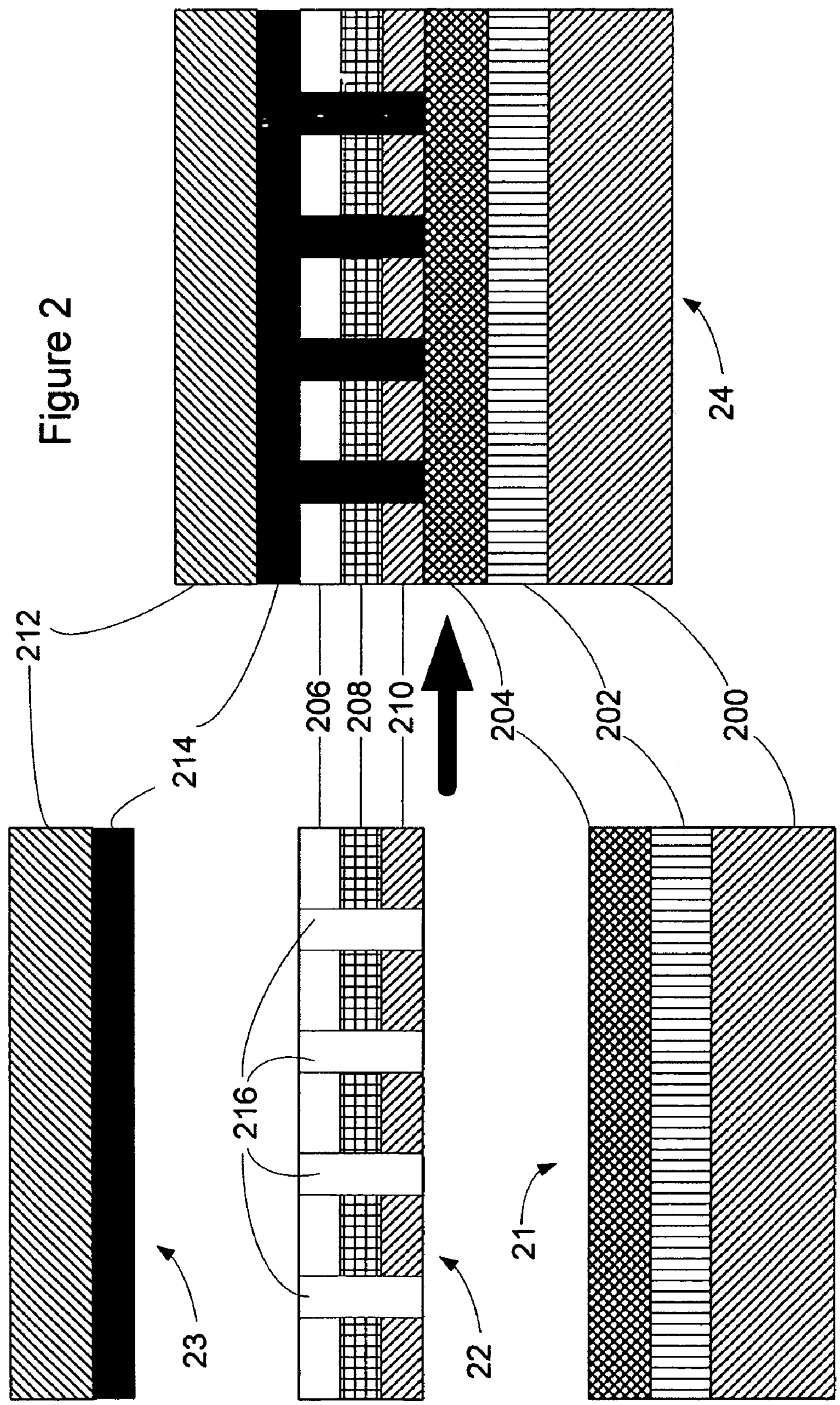
FIG. 2 illustrates a cross-sectional view of an organic light emitting device and method for making the same according to an exemplary embodiment of the invention.

FIG. 2 illustrates a cross-sectional view of an organic light emitting device and method for making the same according to an exemplary embodiment of the invention. In FIG. 2, there is shown a first component 21, a second component 22, and a third component 23 of an exemplary organic light emitting device. These components may be laminated together to form an OLED product 24.

In this example, the first component 21 comprises a substrate 200 which has a cathode layer 202 covered by an emitter layer 204. Cathode layer 202 may comprise one or more low work function metals such as magnesium (Mg) or calcium (Ca). Emitter layer 204 may include one or more organic light emissive materials such as polyphenylenevinylene (P-PPV) or polyfluorene (PF). These organic material layers may have been formed with a process such as spin casting, ink jet printing, screen printing, web coating, physical vapor deposition, or other processes known in the art. The second component 22 comprises a substrate 206, an indium tin oxide (ITO) layer 208 and a polyethylenedioxythiophene (PEDOT) layer 210. ITO layer 208 serves as an anode and the PEDOT layer 210 is a conducting polymer that serves as a charge transport material. Substrate 206 may be a transparent glass or plastic, for example. An array of openings 216 may be formed through the second component 22. In this particular example, the openings are shown as holes drilled or etched through the second component 22. The orientation of the openings may be substantially perpendicular to the upper and lower surfaces of the second component 22. The third component 23 comprises a substrate 212 and an adhesive layer 214. Adhesive layer 214 may be a thermoplastic or other organic material that can form a substantial bond to substrate 206 as well as emitter layer 204. Thus, when components 21, 22 and 23 are laminated together to form OLED product 24, adhesive material 214 may not only bond to the upper surface of substrate 206 as shown in FIG. 2, but also reach through openings 216 to form a bond to the top surface of the first component 21, in this case emitter layer 204. As a result of lamination, the three components may be firmly integrated into one finished product that may not easily delaminate or otherwise come apart even if made into a large area.

Figure 3:
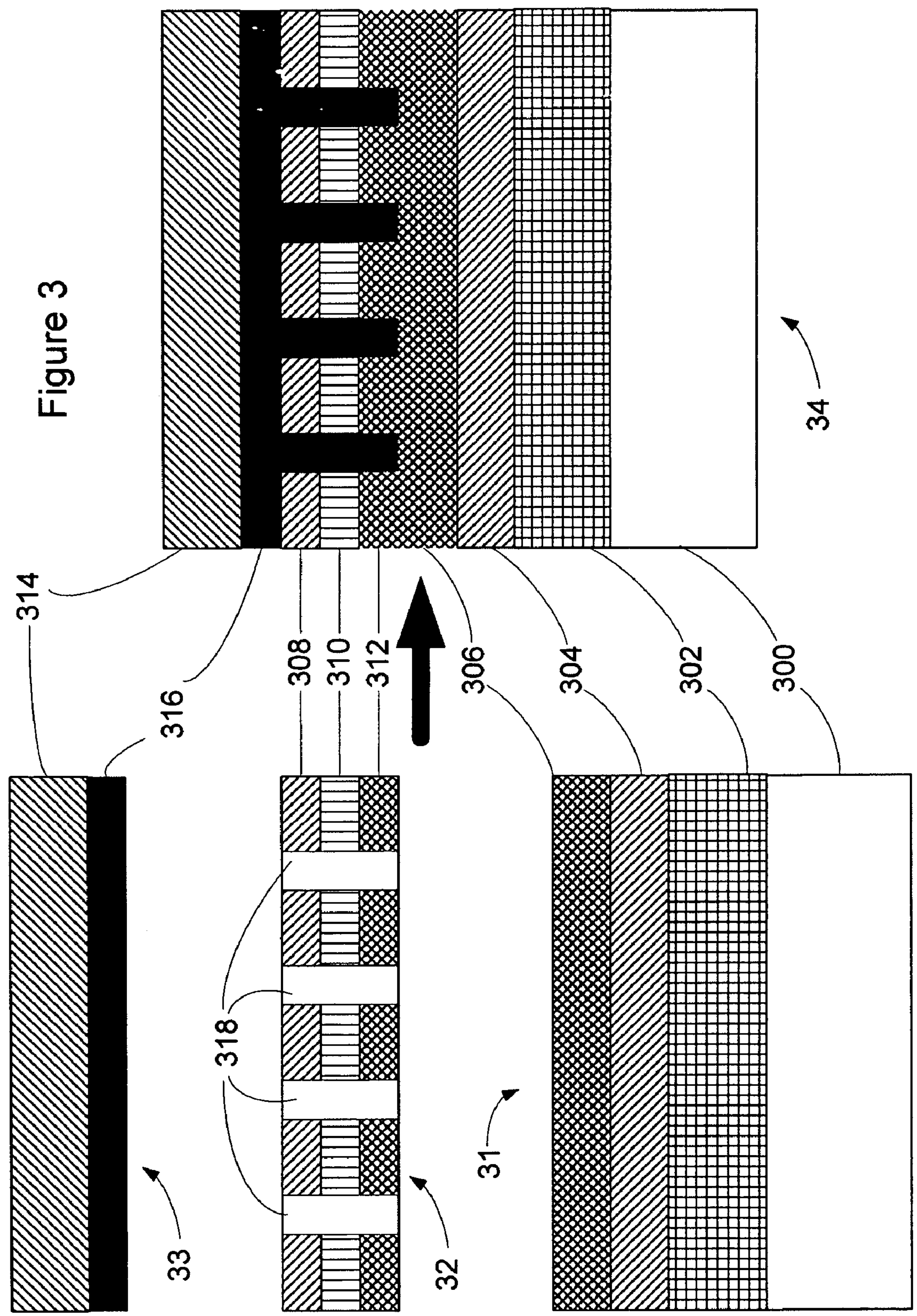
FIG. 3 illustrates a cross-sectional view of another organic light emitting device and method for making the same according to an exemplary embodiment of the invention.

FIG. 3 illustrates a cross-sectional view of another organic light emitting device and method for making the same according to an exemplary embodiment of the invention. In FIG. 3, there is shown a first component 31, a second component 32, and a third component 33 of an exemplary organic light emitting device. These components may be laminated together to form an OLED product 34.

In this example, the first component 31 comprises a substrate 300 which has an ITO layer 302 (anode) covered by a PEDOT layer 304 and an emitter layer 306. The second component 32 comprises a substrate 308, a cathode layer 310 and an emitter layer 312. An array of openings 318 may be formed through the second component 32. The third component 33 comprises a substrate 314 and an adhesive layer 316. When components 31, 32 and 33 are laminated together to form an OLED product 34, adhesive material 316 may bond to both the upper surface of substrate 308 and the top surface of emitter layer 306 through openings 318.

It will be appreciated that the OLED products illustrated in FIGS. 2 and 3 are only two examples in accordance with embodiments of the present invention. Many variations exist in the choice of OLED materials and their layer sequences in the core OLED structure formed in a finished product. In fact, even for the same OLED product, many choices may exist for OLED materials and their layer sequences in the three components before they are laminated.

Figure 4:
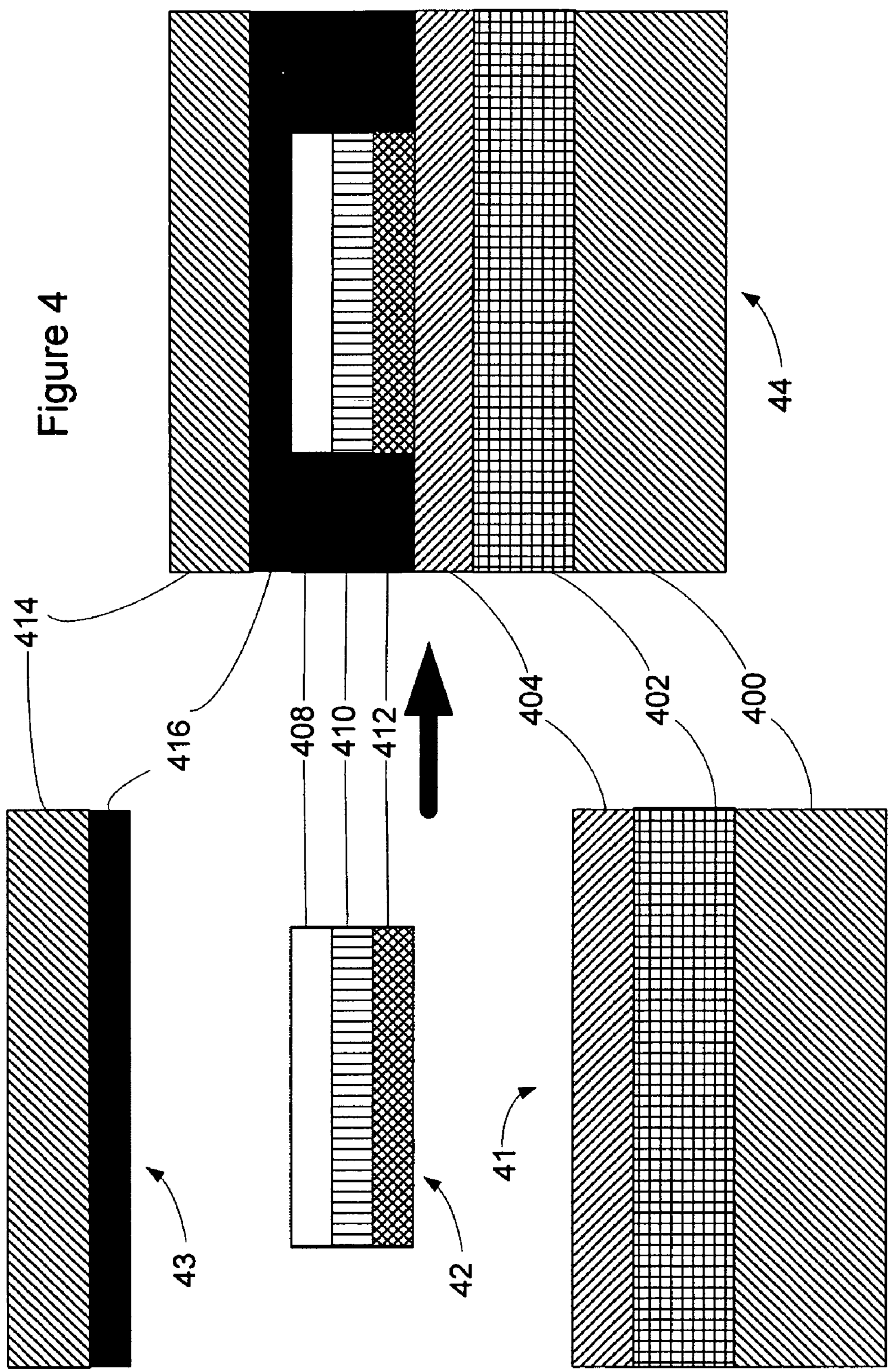
FIG. 4 illustrates a cross-sectional view of yet another organic light emitting device and method for making the same according to an exemplary embodiment of the invention.

FIG. 4 illustrates a cross-sectional view of yet another organic light emitting device and method for making the same according to an exemplary embodiment of the invention. In FIG. 4, there is shown a first component 41, a second component 42, and a third component 43 of an exemplary organic light emitting device, where the second component 42 is smaller than the other two components. The first component 41 comprises a substrate 400 which has an ITO layer 402 (anode) covered by a PEDOT layer 404. The second component 42 comprises a substrate 408, a cathode layer 410 and an emitter layer 412. Openings may or may not be included in the second component 42. The third component 43 comprises a substrate 414 and an adhesive layer 416. When components 41, 42 and 43 are laminated together to form finished OLED product 44, adhesive material 416 may bond to both the upper surface of substrate 408 and the top surface of PEDOT layer 404 in locations beyond the edges of the second component 42. Due to its smaller size relative to the first and third components 41 and 43, the second component 42 may become encapsulated between components 41 and 43 after lamination. Depending on the size of the second component 42 as well as desired bonding strength, it may or may not be desirable to form openings in the second component 42 prior to lamination.

Figure 5:
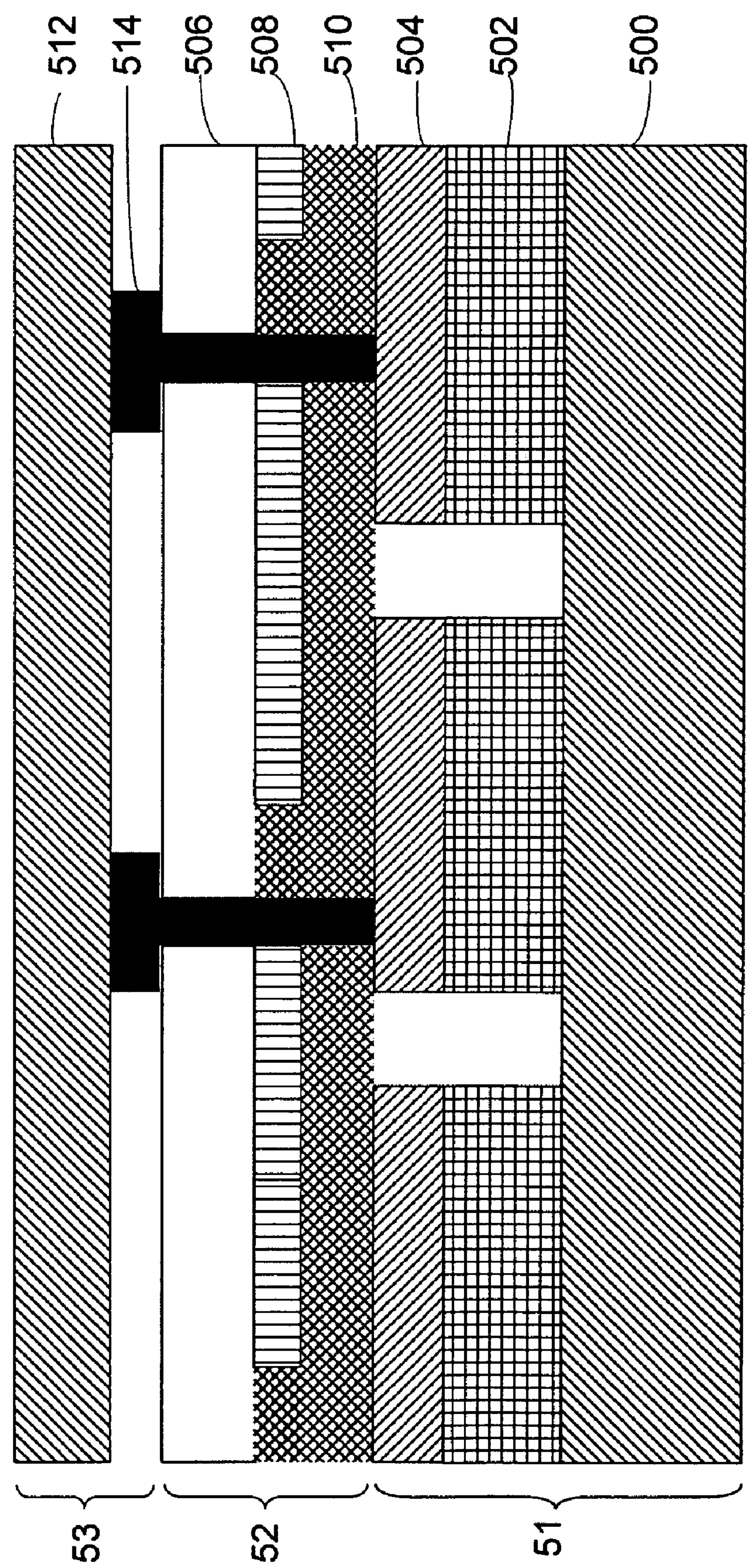
FIG. 5 illustrates a cross-sectional view of still another organic light emitting device according to an exemplary embodiment of the invention.

FIG. 5 illustrates a cross-sectional view of still another organic light emitting device according to an exemplary embodiment of the invention where electrical interconnection is provided by adopting an adhesive material that is also electrically conductive. This OLED is fabricated by laminating components 51, 52 and 53. The first component 51 comprises a substrate 500 covered with a patterned ITO layer 502 and a patterned PEDOT layer 504. The second component 52 comprises a substrate 506, a patterned cathode layer 508 and an organic emitter layer 510. The third component 53 comprises a non-conductive substrate 512 and a patterned conductive epoxy layer 514. When the three components are laminated together, the conductive epoxy 514 may act not only as an adhesive to bond the three components together, it may also provide electrical interconnection among the different layers of the OLED product. The three components and the openings may be designed to provide desired configurations of the electrical interconnection. The exemplary configuration of the device shown in FIG. 5 effectuates a serially connected architecture. The structure may be viewed as a number of smaller OLEDs connected in series, where, under a proper voltage bias, current may flow from one part to another through the interconnection points created by the conductive epoxy.

Figure 7:
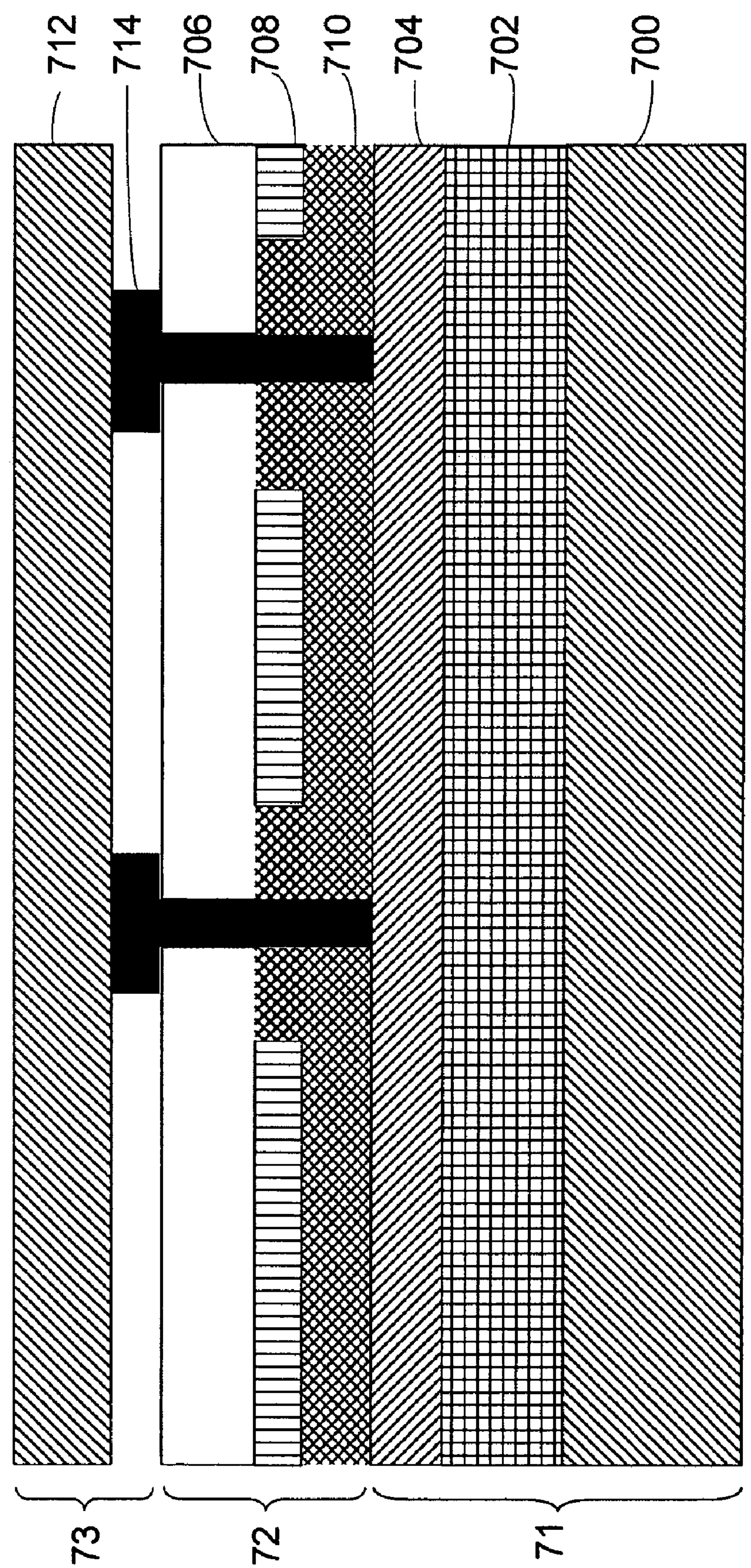
FIG. 7 illustrates a cross-sectional view of one organic light emitting device according to an exemplary embodiment of the invention.

Another example of an interconnection configuration is shown in FIG. 7. This OLED is fabricated by laminating components 71, 72 and 73. The first component 71 comprises a substrate 700 covered with an ITO layer 702 and a PEDOT layer 704. The second component 72 comprises a substrate 706, a patterned cathode layer 708 and an organic emitter layer 710. The third component 73 comprises a conductive substrate 712 and a patterned conductive epoxy layer 714. When the three components are laminated together, the conductive epoxy 714 may provide electrical interconnection between the substrate 712 and the first component 71. In one application, substrate 712 may comprise a highly conductive metal foil structured as a bus line to reduce the sheet resistance of the less conductive ITO/PEDOT bi-layer anode. As a result, the structure shown in FIG. 7 may be viewed as a number of smaller OLEDs connected to the bus line (or bus bar) in parallel.

The serially connected architecture and the parallel connected architecture, as exemplified in FIGS. 5 and 7 respectively, may be combined in configuring electrical interconnections. Other variations are also possible. Further, conductive adhesive materials other than epoxy may also be used.

According to another embodiment of the present invention, it may be desirable to add one or more adhesive materials to the active organic layers of an organic light emitting device. The advantage of blending an emissive polymer with adhesive material(s) can be twofold. It may help create more intimate contact between laminated surfaces. For example, surface contact between an emissive polymer layer and a PEDOT layer, or between an emissive polymer layer and a metal electrode layer, may be strengthened. In addition, blending an emissive polymer with adhesive material(s) may also enhance the efficiency of an OLED. According to embodiments of the invention, a number of adhesives or their combinations may be used. Examples of adhesives which may be used include epoxies, acrylates, acrylimide, isocyanates, polyurethanes, melamine formaldehyde and unsaturated polyesters. To maintain a high light extraction efficiency, the adhesive material selected should be substantially transparent to the light emitted from the light emissive material. A composite of an adhesive mixed with an organic light emissive material may be prepared by dissolving them into a same solvent or a same mixture of two or more miscible solvents. Next, the composite may be applied by the process of spin-coating, spray coating, dip coating, screen printing, ink-jet printing or roller coating, for example. The adhesive may be cured by ultra-violet (UV) irradiation or at a temperature between approximately 50° C. and approximately 250° C. Typically, in the composite, the light emissive material is the most abundant ingredient on a weight basis.

Figure 10:
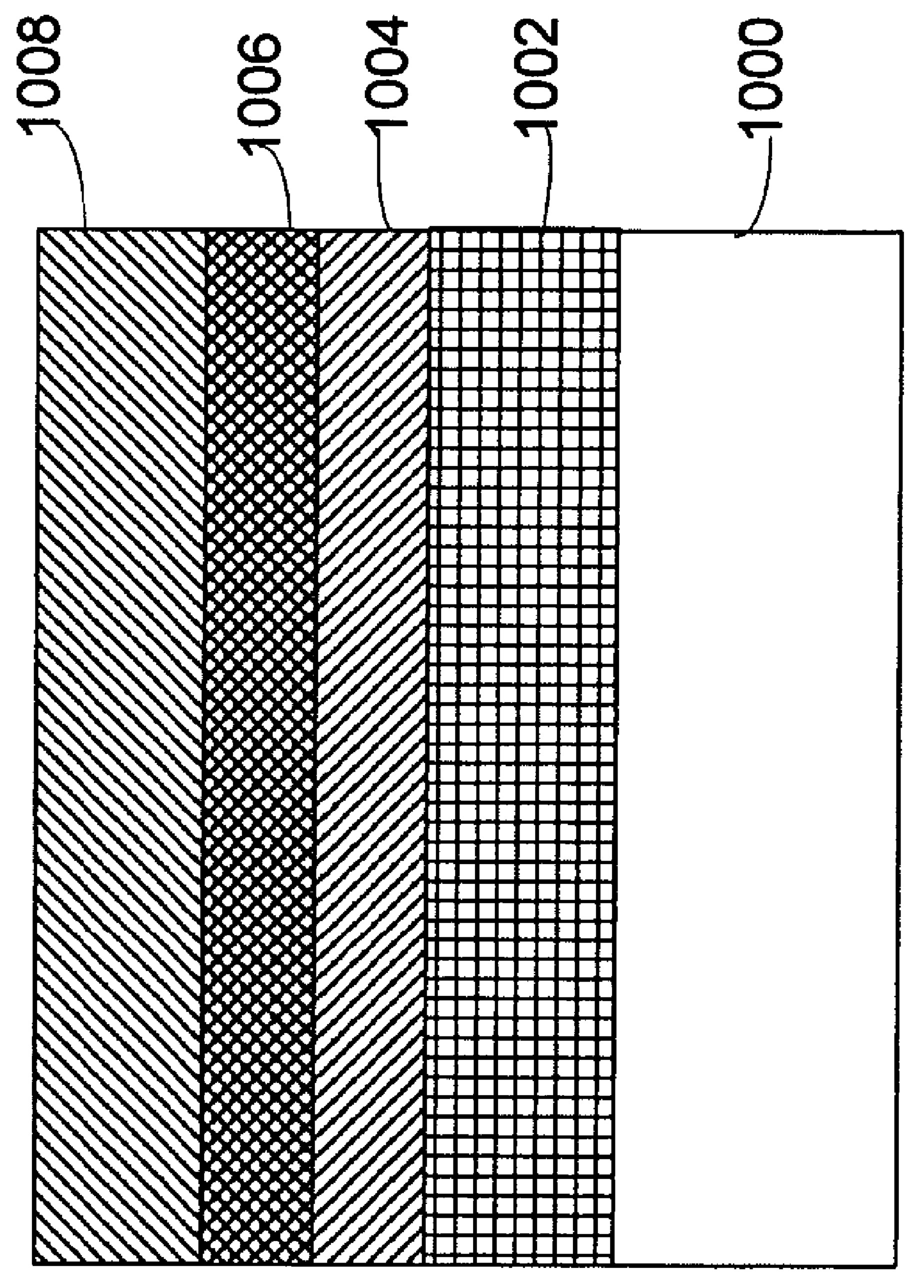
FIG. 10 illustrates yet another exemplary organic light emitting device according to an embodiment of the present invention.

FIG. 10 illustrates one exemplary organic light emitting device incorporating one or more adhesive materials according to an embodiment of the present invention. This OLED comprises a substrate 1000, an anode (ITO) layer 1002, a PEDOT layer 1004, a composite layer 1006 and a cathode layer 1008. The composite layer 1006 may be formed by mixing emissive polymer ADS329 with adhesive material Norland 68.

According to one embodiment of the invention, an OLED may be fabricated by laminating only a first and a second component when an adhesive is mixed into a polymer layer to increase the interfacial bonding between the two components. In this case, a third component may not be necessary.

EXAMPLE 1

An OLED device was formed as follows. A first component comprised a polyethylene terephthalate (PET) substrate coated with an ITO layer and a PEDOT layer. A second component comprised a PET substrate coated with an ITO layer and a layer of polymer blend in which an emissive polymer, ADS329 (Poly(9,9-dioctylfluorenyl-2,7-diyl), purchased from American Dye Source, Inc. (555 Morgan Boulevard, Baie D.Urfe, Quebec, Canada H9X 3T6), was blended with an adhesive material, Norland Optical Adhesive 68 ("Norland 68"), purchased from Norland Products, Inc. (Cranbury, N.J. 08512, U.S.A.). The first component thus had a structure of PET/ITO/PEDOT and the second component had a structure of PET/ITO/(polymer blend). These two components were subsequently laminated together followed by a short (30 seconds) exposure to UV irradiation. Before lamination, photoluminescence was only observed (due to ADS329) from the second component. After lamination, the laminated film was separated on purpose. Photoluminescence now was seen on both sides, indicating ADS329 in the second component had been partially transferred onto the surface of PEDOT in the first component due to the strengthened adhesion.

EXAMPLE 2

In another experiment, two working devices with a structure of PET/ITO/PEDOT/(polymer blend)/Al/PET were made via lamination of separate components, wherein Al was an aluminum cathode layer and the polymer blend comprised a blend of ADS329 and Norland 68. The first device was made using a component with a structure of PET/ITO/PEDOT/(polymer blend) and a component with a structure of PET/Al. The second device was made using a component with a structure of PET/ITO/PEDOT and a component with a structure of PET/Al/(polymer blend). The polymer blend layer was spin-coated and the laminated film stacks were cured using a long wavelength (365 nm) UV-lamp for five minutes in air. Both devices showed enhanced mechanical properties, i.e. strengthened adhesion between the PEDOT and the emissive polymer, as well as between the emissive polymer and the Al cathode.

EXAMPLE 3

In another example, emissive polymer ADS329 was mixed with adhesive material Norland 68. The blend solution was prepared by mixing 52 milligrams of ADS329 with 19 milligrams of degassed Norland 68 in an amber vial at room temperature in air, purging the mixture in nitrogen for 40 minutes, adding 4 milliliters of M-xylene (anhydrous), heating the solution at 75° C. (stirring with a stir bar) for one hour and cooling down to room temperature in a nitrogen-purged box. An organic light emitting device ("Device A") was fabricated following the steps of: (1) spin-coating PEDOT onto a pre-cleaned, UV-ozoned ITO substrate; (2) baking the ITO/PEDOT substrate at 170° C. for 30 minutes and then cooling it down to room temperature in a nitrogen-purged box; (3) spin-coating the blend solution, as prepared above, onto the ITO/PEDOT substrate, then partially curing it with a long-wavelength (365 nm) UV-lamp for 30 seconds; (4) transferring the sample into an argon-purged box (moisture and oxygen less than 1 ppm); (5) thermally evaporating and depositing the cathode materials—NaF(4 nm)/Al (100 nm) onto the sample; and (6) encapsulating the sample with a piece of cover glass with Norland 68. A similar device ("Device B") was also fabricated with the emissive polymer but without the adhesive.

Figure 6:
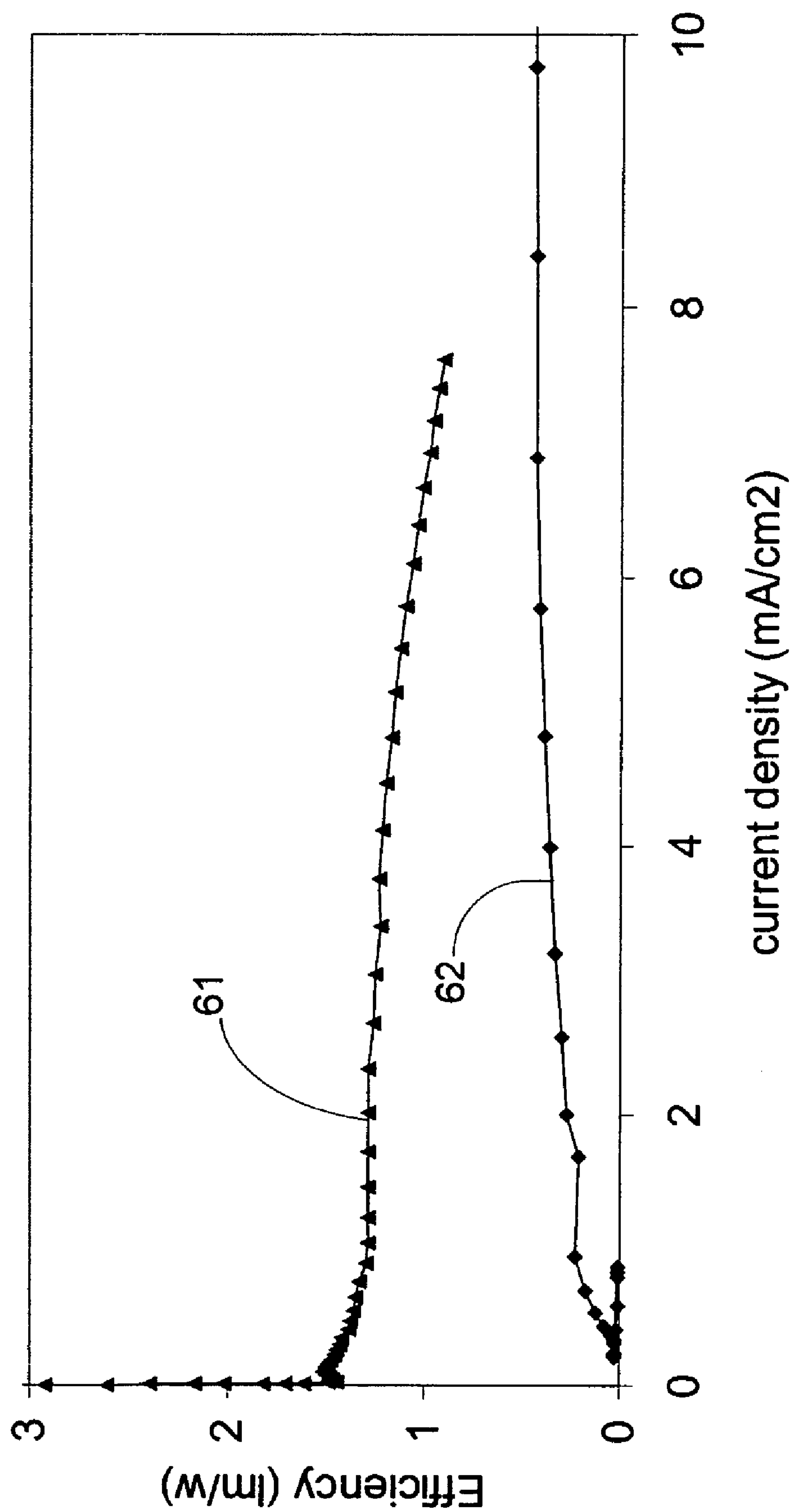
FIG. 6 illustrates a performance comparison between two organic light emitting devices according to an exemplary embodiment of the invention.

The performance of these two devices was examined in a current-voltage-brightness measurement and the results plotted in FIG. 6. Referring to FIG. 6, curve 61 illustrates the device efficiency of Device A and curve 62 illustrates the device efficiency of Device B. As shown, Device A exhibited a much higher efficiency than Device B.

EXAMPLE 4

Figure 8:
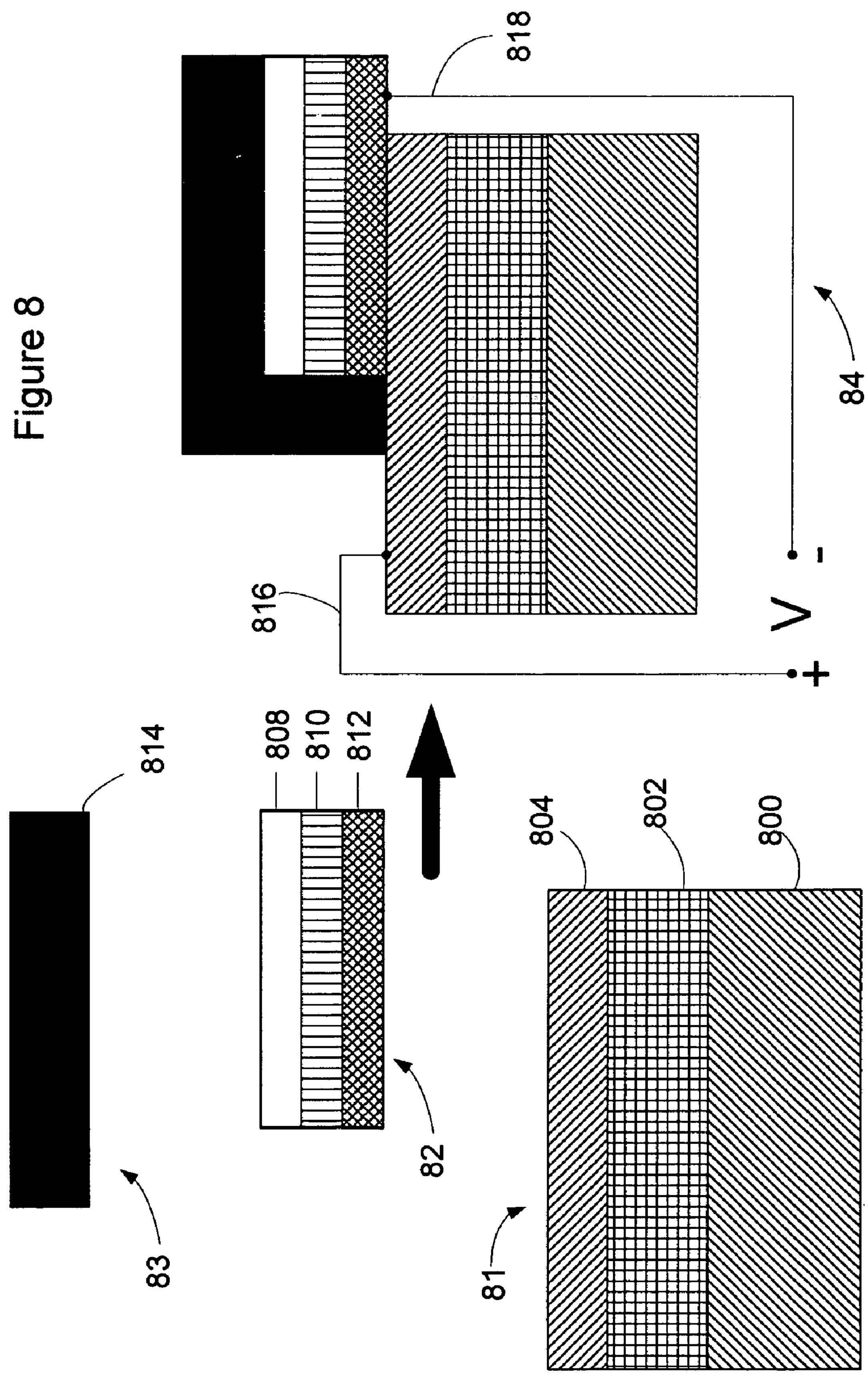
FIG. 8 illustrates an exemplary organic light emitting device according to an embodiment of the present invention.

FIG. 8 illustrates an exemplary organic light emitting device according to an embodiment of the present invention. This OLED was fabricated by laminating three components, 81, 82 and 83. The first component 81 was prepared by spin-coating a PEDOT layer 804 about 60 nm thick onto a pre-cleaned and UV-ozoned PET(800)/ITO(802) substrate. Thus component 81 had a structure of PET/ITO/PEDOT. The second component 82 was prepared by thermally evaporatting an 80 nm-thick Al layer 810 onto a PET substrate 808, and subsequently spin-coating the substrate with a polyfluorene-based light emitting polymer 812 about 80 nanometers (nm) thick. Thus component 82 had a structure of PET/Al/(emissive polymer). The third component 83 comprised a 3M™ LS851 self-laminating card protector 814 used as received without any treatment. The three components were laminated with an Attalam™ 110L roller laminator at 130° C. The finished OLED had a structure of PET/ITO/PEDOT/(emissive polymer)/Al/PET/(3M™ card protector). The efficiency of the device measured at a constant voltage (9V) applied between electrical contacts 816 and 818 was about 0.14 cd/A. In a comparison experiment, following the above procedures, devices were made without the third component 83. None of these devices turned out to be working due to de-lamination, which indicated that the interfacial adhesion between the first and second components was weak.

Figure 9:
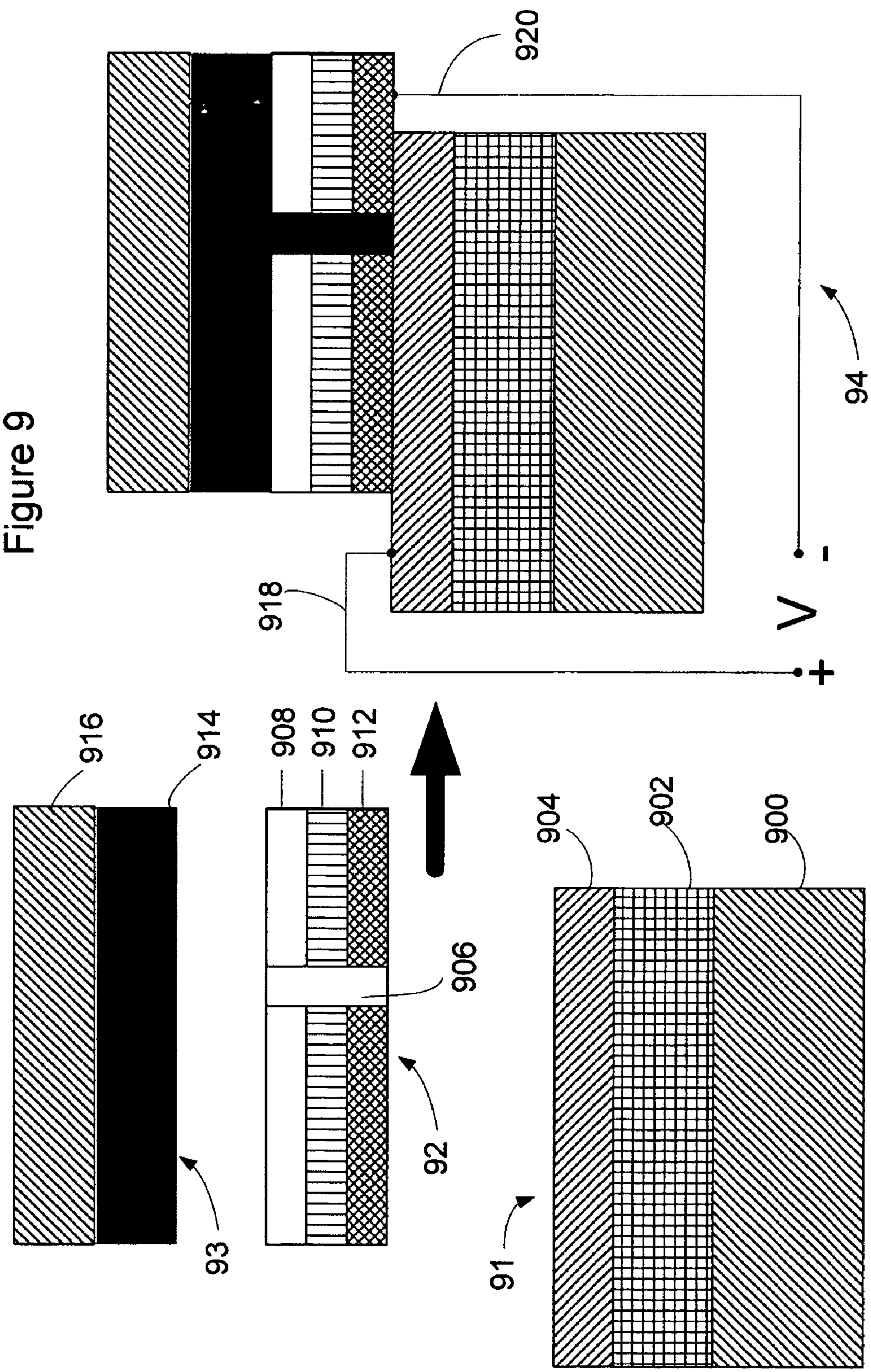
FIG. 9 illustrates another exemplary organic light emitting device according to an embodiment of the present invention.

FIG. 9 illustrates another exemplary organic light emitting device according to an embodiment of the present invention. This OLED was fabricated by laminating three components, 91, 92 and 93. The first component 91 was prepared by spin-coating a PEDOT layer 904 about 60 nm thick onto a pre-cleaned and UV-ozoned Glass(900)/ITO(902) substrate. Thus the component 91 had a structure of Glass/ITO/PEDOT. The second component 92 was prepared by depositing an 80 nm Al layer 910 onto a PET substrate 908 via thermal evaporation, spin-coating a polyfluorene-based light emitting polymer 912 about 80 nm thick, and forming one hole 906 through the component 92 with a stationery punch. Thus the component 92 had a structure of PET/Al/(emissive polymer) with a hole through it. The third component 93 was prepared by applying the Norland 68 adhesive 914 onto a pre-cleaned cover glass 916. Thus the component 93 had the structure of Glass/(Norland 68). The three components were laminated together on a hotplate at 150° C. The finished OLED had a structure of PET/ITO/PEDOT/(emissive polymer)/Al/(Norland 68)/Glass. The OLED was tested by applying a DC voltage between the electrical contacts 918 and 920. Light emissions from the device could be turned on or off in response to the applied voltage.

While the foregoing description includes many details and specificities, it is to be understood that these have been included for purposes of explanation only, and are not to be interpreted as limitations of the present invention. It will be apparent to those skilled in the art that other modifications to the embodiments described above can be made without departing from the spirit and scope of the invention. Accordingly, such modifications are considered within the scope of the invention as intended to be encompassed by the following claims and their legal equivalents.

What is claimed is:

1. A method for making an electro-optic device, the method comprising:

forming a first component comprising at least one first material on a first substrate; forming a second component comprising at least one second material on a second substrate, wherein at least one opening is formed through the second component; forming a third component; and laminating the first component, the second component and the third component together such that the second component is located between the first component and the third component, the at least one first material and the at least one second material form at least part of an organic electro-optic device located between the first substrate and the second substrate, the third component is bonded to the second component, and the third component is bonded to the first component through the at least one opening wherein the at least one opening through the second component comprises a grid of regularly spaced openings.

2. The method according to claim 1, wherein the organic electro-optic device is a light emitting device.

3. The method according to claim 1, wherein the organic electro-optic device is a photovoltaic device.

4. The method according to claim 1, wherein the at least one first material or the at least one second material comprises at least one of:

an organic light emissive material;

a light-absorbing photovoltaic material;

a charge transport material; and an electrode material.

5. The method according to claim 1, wherein the at least one first material or the at least one second material comprises one or more of the following electroluminescent materials:

poly(p-phenylene vinylenes),
polyphenylenes,
polythiophene,
polyquinolines,
polyfluorenes,
poly(vinylcarbazole),
polystyrene with quaterphenylene segments,
poly(disilanyleneoligothienylene),
tris(8-quinolinolato)aluminum, and
coumarin.

6. The method according to claim 1, wherein the at least one opening through the second component is substantially perpendicular to the second substrate.

7. The method according to claim 1, wherein the third component comprises at least one adhesive material that forms a bond to the second component and the first component.

8. The method according to claim 7, wherein the at least one adhesive material comprises a thermoplastic film.

9. The method according to claim 7, wherein the at least one adhesive material comprises one or more of:

epoxy;
acrylate;
acrylimide;
isocyanate;
polyurethane;
melamine formaldehyde; or
unsaturated polyester.

10. The method according to claim 1, wherein the third component comprises at least one electrically conductive material that provides electrical interconnection among the first component, the second component and the third component through the at least one opening.

11. The method according to claim 10, wherein the at least one electrically conductive material comprises a conductive epoxy.

12. The method according to claim 1, wherein the third component comprises at least one color-modifying material that can modify one or more emission colors of the organic light emitting device.

13. The method according to claim 12, wherein the at least one color-modifying material comprises a plurality of down-conversion phosphor layers.

14. The method according to claim 1, wherein the third component comprises a plurality of scattering particles to enhance the light-extraction efficiency of the organic electro-optic device.

15. The method according to claim 1, wherein the step of laminating the first component, the second component and the third component together comprises:

laminating the first component and the second component together to form an intermediate structure; and laminating the third component with the intermediate structure.

16. The method according to claim 1, wherein the step of laminating the first component, the second component and the third component together comprises:

laminating the second component and the third component together to form an intermediate structure; and laminating the first component with the intermediate structure.

17. The method according to claim 1, where the first component or the second component comprises at least one organic light emissive material mixed with at least one adhesive material.

* * * * *